United States Patent
Gallegos et al.

(10) Patent No.: US 9,496,730 B2
(45) Date of Patent: Nov. 15, 2016

(54) SYSTEMS AND METHODS FOR BATTERY MANAGEMENT

(75) Inventors: Nicky G. Gallegos, Westminster, CO (US); Michael Walker, Thornton, CO (US)

(73) Assignee: Proterra Inc., Greenville, SC (US)

( * ) Notice: Subject to any disclaimer, the term of this patent is extended or adjusted under 35 U.S.C. 154(b) by 590 days.

(21) Appl. No.: 13/193,278

(22) Filed: Jul. 28, 2011

(65) Prior Publication Data
US 2012/0105001 A1     May 3, 2012

Related U.S. Application Data

(60) Provisional application No. 61/379,671, filed on Sep. 2, 2010.

(51) Int. Cl.
    *H02J 7/14*           (2006.01)
    *H02J 7/00*           (2006.01)
    (Continued)

(52) U.S. Cl.
CPC ............ *H02J 7/0027* (2013.01); *B60L 3/0046* (2013.01); *B60L 3/0069* (2013.01); *B60L 3/0092* (2013.01); *B60L 3/04* (2013.01); *B60L 11/005* (2013.01); *B60L 11/1816* (2013.01); *B60L 11/1838* (2013.01); *B60L 11/1866* (2013.01); *B60L 11/1874* (2013.01); *H01M 10/0525* (2013.01); *H01M 10/441* (2013.01); *H02J 7/0016* (2013.01); *B60L 2210/10* (2013.01); *B60L 2240/36* (2013.01); *B60L 2240/545* (2013.01);
(Continued)

(58) Field of Classification Search
CPC .................. Y02T 10/705; Y02T 10/7055

USPC .................................................. 320/104, 116
See application file for complete search history.

(56) References Cited

U.S. PATENT DOCUMENTS 5,703,464 A * 12/1997 Karunasiri ............ B60L 3/0046
                                                                 180/65.8
5,773,962 A * 6/1998 Nor ........................ B60L 11/185
                                                                  320/116
(Continued)

FOREIGN PATENT DOCUMENTS

JP          2009-050085 A      3/2009

OTHER PUBLICATIONS

John Ayers, Digital Integrated Circuits, 2004.*
(Continued)

*Primary Examiner* — Richard Isla Rodas
*Assistant Examiner* — Michael Dibenedetto
(74) *Attorney, Agent, or Firm* — Bookoff Mcandrews, PLLC

(57) ABSTRACT

A battery management system includes several subsystem blocks, an Energy Storage Master unit, and several battery pack systems. The Energy Storage Master may interface with the Vehicle Master Controller by way of CAN or other communication method to an External Charger. Each battery module within a battery pack may include a Local Module Unit which may communicate with a Pack Master. The Pack Master may communicate with and may be controlled by the Energy Storage Master. Thus, there is a processor to monitor groups of battery cells, a second processor to collect further information about the cell groups, and a third module that takes high-level information from each cell group processor to process and pass on to other vehicle controllers or charger controllers. An integrated BMS may enable cell monitoring, temperature monitoring, cell balancing, string current monitoring, and charger control integration.

19 Claims, 13 Drawing Sheets

(51) Int. Cl.
| | |
|---|---|
| *B60L 3/00* | (2006.01) |
| *B60L 3/04* | (2006.01) |
| *B60L 11/00* | (2006.01) |
| *B60L 11/18* | (2006.01) |
| *H01M 10/0525* | (2010.01) |
| *H01M 10/44* | (2006.01) |
| *G01R 31/36* | (2006.01) |

(52) U.S. Cl.
CPC ..... *B60L 2240/547* (2013.01); *B60L 2240/549* (2013.01); *B60L 2250/10* (2013.01); *B60L 2250/16* (2013.01); *G01R 31/3658* (2013.01); *Y02E 60/122* (2013.01); *Y02T 10/7005* (2013.01); *Y02T 10/7011* (2013.01); *Y02T 10/7022* (2013.01); *Y02T 10/7055* (2013.01); *Y02T 10/7061* (2013.01); *Y02T 10/7072* (2013.01); *Y02T 10/7216* (2013.01); *Y02T 90/121* (2013.01); *Y02T 90/127* (2013.01); *Y02T 90/128* (2013.01); *Y02T 90/14* (2013.01); *Y02T 90/16* (2013.01); *Y02T 90/163* (2013.01)

(56) References Cited

U.S. PATENT DOCUMENTS

| | | | | |
|---|---|---|---|---|
| 5,814,970 | A * | 9/1998 | Schmidt | H01M 10/441 320/118 |
| 6,614,233 | B2 * | 9/2003 | Sugimoto | G01R 31/3658 324/434 |
| 7,764,496 | B2 * | 7/2010 | Nguyen et al. | 361/697 |
| 2004/0135546 | A1 * | 7/2004 | Chertok | B60L 11/185 320/118 |
| 2005/0083016 | A1 * | 4/2005 | Yau | H02J 7/0018 320/116 |
| 2006/0071643 | A1 * | 4/2006 | Carrier | H01M 10/4257 320/132 |
| 2006/0152189 | A1 * | 7/2006 | Ambrosio et al. | 320/104 |
| 2008/0086247 | A1 * | 4/2008 | Gu | H02J 7/0022 701/36 |
| 2008/0276824 | A1 * | 11/2008 | King | B60L 7/08 105/50 |
| 2009/0027009 | A1 * | 1/2009 | Sivertsen | B60L 11/1866 320/134 |
| 2009/0107743 | A1 * | 4/2009 | Alston | B60H 1/00428 180/65.21 |
| 2009/0206798 | A1 * | 8/2009 | Choi | B60K 6/28 320/150 |
| 2010/0013439 | A1 * | 1/2010 | Altman | H02J 9/061 320/139 |
| 2010/0055543 | A1 * | 3/2010 | Tae | B60L 11/1803 429/50 |
| 2010/0066379 | A1 * | 3/2010 | Iida | 324/434 |
| 2010/0097034 | A1 * | 4/2010 | Shu et al. | 320/126 |
| 2010/0116570 | A1 * | 5/2010 | Sugawara et al. | 180/65.1 |
| 2010/0261048 | A1 * | 10/2010 | Kim | H01M 10/44 429/150 |
| 2010/0275810 | A1 * | 11/2010 | Barbee et al. | 105/50 |
| 2010/0327806 | A1 * | 12/2010 | Brisebois | G01R 31/3658 320/116 |
| 2011/0025270 | A1 * | 2/2011 | Nakanishi | 320/116 |
| 2011/0121785 | A1 * | 5/2011 | Iida | H01M 10/443 320/118 |

OTHER PUBLICATIONS

U.S. Appl. No. 13/820,709, filed Mar. 4, 2013, Gallegos et al.
International search report and written opinion dated Mar. 21, 2012 for PCT/US2011/045791.

* cited by examiner

SYSTEMS AND METHODS FOR BATTERY MANAGEMENT

This application claims the benefit of U.S. Provisional Application No. 61/379,671, filed Sep. 2, 2010, which application is incorporated herein by reference.

BACKGROUND

A BMS, or Battery Management System is a device or multiple devices that control some or all aspects of an advanced energy storage system. Some aspects that may be controlled include monitoring voltages of each cell or groups of energy storage cells, monitoring current, monitoring temperatures throughout energy storage units(s), calculating States of Charge (SoC), calculating and/or tracking States of Health (SoH), and/or modifying State of Charge to balance the storage unit voltages or SoC's.

A BMS may be used in any number of applications ranging anywhere from vehicles to cell phones to laptops to large stationary grid balancing plants. A BMS will typically be used on an advanced battery system consisting of many cells connected in a series/parallel configuration, although occasionally a BMS may be used on a less advanced battery system that needs a longer lifespan from the batteries such as in a vehicle application or an ultracapacitor system requiring precise control over its cell voltages and SoC's.

The Battery Management System in any system may report information about the system back to a central computer or control aspects of the battery system itself. Much of the function of a BMS will be determined at the design stage of a particular implementation, however it will always be used to collect data about the battery system and calculate important parameters, then either transmit or use that data to adjust aspects of the energy storage system.

What is needed is an improved battery management system to better balance and manage cells.

SUMMARY

The invention provides improved battery management systems and methods. Various aspects of the invention described herein may be applied to any of the particular applications set forth below. The invention may be applied as a standalone battery management system or as a component of an integrated solution for battery management. The invention can be optionally integrated into existing business and battery management processes seamlessly. It shall be understood that different aspects of the invention can be appreciated individually, collectively or in combination with each other.

In one embodiment, a battery management system includes: a plurality of local module units, wherein each local module unit monitors at least a cell voltage, temperature, humidity and current from a plurality of battery cells; at least one pack master board for aggregating data from and communicating with the plurality of local module units; an energy storage master for interfacing with a vehicle master controller; and an external charger, the external charger in communication with the vehicle master controller. The pack master board communicates with the energy storage master to command charge transfer between the plurality of battery cells.

Other goals and advantages of the invention will be further appreciated and understood when considered in conjunction with the following description and accompanying drawings. While the following description may contain specific details describing particular embodiments of the invention, this should not be construed as limitations to the scope of the invention but rather as an exemplification of preferable embodiments. For each aspect of the invention, many variations are possible as suggested herein that are known to those of ordinary skill in the art. A variety of changes and modifications can be made within the scope of the invention without departing from the spirit thereof.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

DETAILED DESCRIPTION

Figure 1:
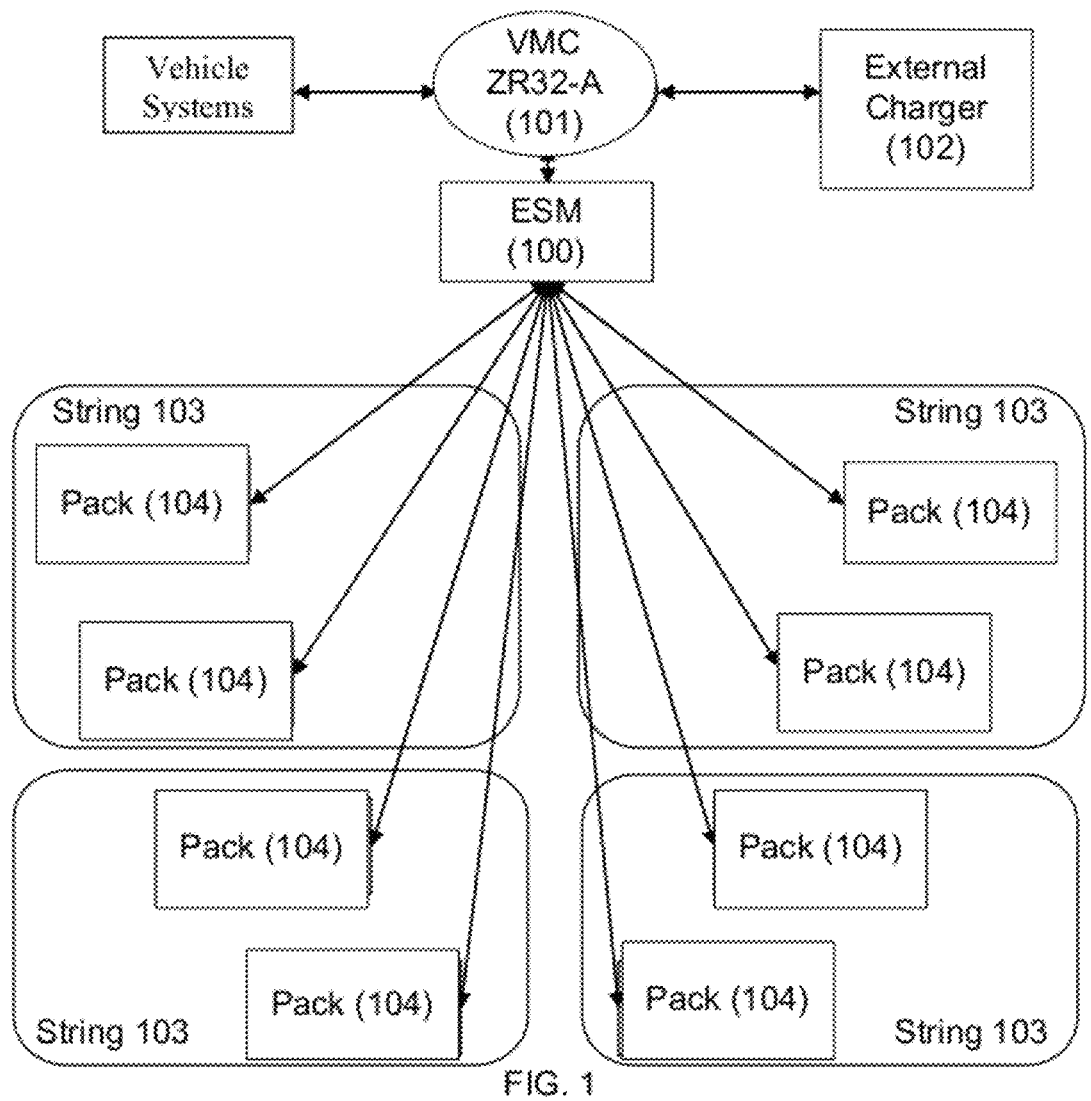
FIG. 1 illustrates an example of an architecture of a battery management system, in accordance with embodiments of the invention.

In the following detailed description, numerous specific details are set forth in order to provide a thorough understanding of the invention. However it will be understood by those of ordinary skill in the art that the invention may be practiced without these specific details. In other instances, well-known methods, procedures, components and circuits have not been described in detail so as not to obscure the invention. Various modifications to the described embodiments will be apparent to those with skill in the art, and the general principles defined herein may be applied to other embodiments. The invention is not intended to be limited to the particular embodiments shown and described.

Lithium Ion battery systems require cell balancing throughout their lifetime in order to maintain a maximum amount of usable energy and cycle life of the batteries. A battery management system (BMS) in accordance with embodiments of the present invention may balance these cells and create a communication and control link to the rest of the system in which the batteries are installed. The effectiveness of the system is highly affected by the way in which this system is organized and implemented. Since all battery types can benefit from cell balancing and this system can react to other chemistries by changing the firmware in a mater pack, systems and methods for implementing a BMS as further described herein can adapt to other types of cell chemistries with proper programs controlling balance and charge.

In an aspect of embodiments of the present invention, a battery management system (BMS) is provided. As further described below, the physical layout of the BMS may include many Local Module Units (LMU's), with low amounts of processing power to provide local information at a module level. Each Local Module Unit may be attached via a relatively long isolated communication link to an intermediate controller which consolidates information and makes decisions about cell balancing. The intermediate controller may relays macro-level information to an Energy Storage Master (ESM) controller, and the Energy Storage Master may make high level decisions about the Energy Storage System and potentially control charge algorithms and communication. This master level controller may also provide feedback to other controllers on a Controller Area Network (CAN), e.g., ISO 11898 which may define the physical later, although the specific communication language is not important. As a result, a very high rate cell balancing creates the opportunity to balance cells while charging the energy storage system at very high rates. Such rates may exceed five times the C rate of the storage system. Further, the very high rate cell balancing is the key to charging batteries at extreme rates of charge. Balancing can be accomplished suing resistive shunt bleed or active balancing with isolated DC-DC converters or capacitive switching, or any other method known to practitioners of the art.

System Architecture:

Referring to FIG. 1, in one embodiment, a battery management system includes several subsystem blocks, an Energy Storage Master unit 100, and Traction Pack Systems 104. The Energy Storage Master may interface with the Vehicle Master Controller (ZR32-A) 101 with a pass through from the Energy Storage Master 100 by way of CAN or other communication method to an External Charger 102. The Vehicle Master Controller 101 may interface with the External Charger 102 either directly or through a charging station interface. The energy storage system may include several strings of batteries 103 in an electric vehicle. Within each of these strings 103, there may be packs 104, and each pack is comprised of several battery modules. The Traction Packs 104 may communicate to the Energy Storage Master 100 by way of a second CAN bus. Two packs 104 may make up a string 103. The packs may be controlled by a pack master, which may communicate with the Energy Storage Master 100 using a single CAN bus for the entire system. Each pack master may communicate with its Local Module Unit using an Serial Peripheral Interface (SPI) bus. The Local Module Unit and Pack Master communications may be isolated. In one embodiment, the battery modules containing 10 prismatic battery cells each, there are 8 battery modules per pack, 2 packs per string, and a variable number of strings per vehicle (typically 3 to 4).

Figure 2:
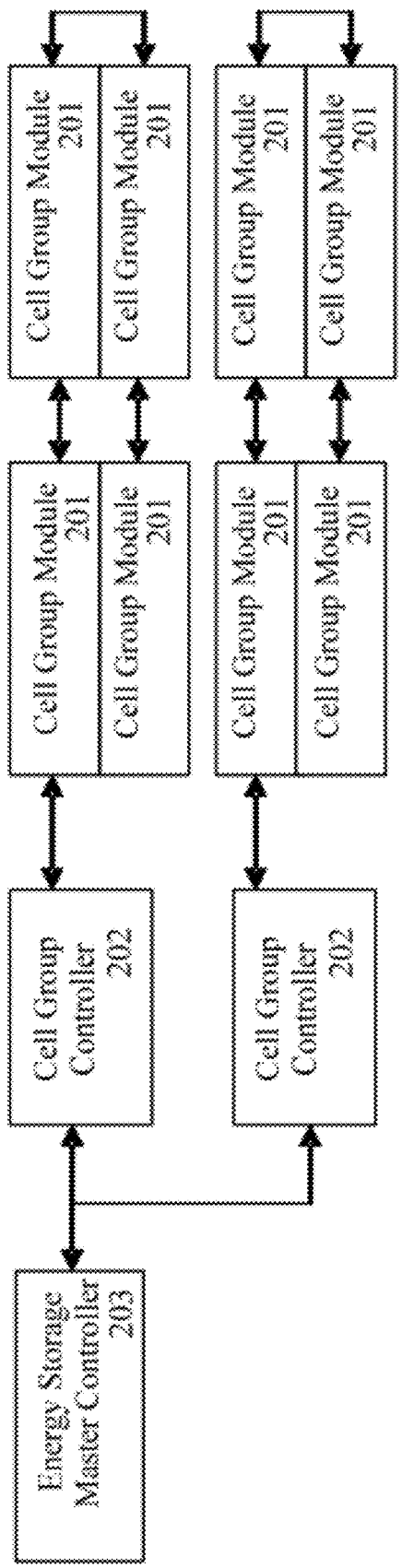
FIG. 2 illustrates an example of an overall system architecture of various levels of controllers, in accordance with embodiments of the invention.

Referring to FIG. 2, an example of an overall system architecture of various levels of controllers is illustrated. In one embodiment, the system architecture includes three modules, one to monitor groups of battery cells 201, a second processor module to collect further information about the cell groups 202, and a third module 203 that takes high-level information from each cell group processor to process and pass on to other vehicle controllers or charger controllers. In this implementation the cell group monitor 201 can observe anywhere from 4 to 12 cells and monitor up to 8 temperatures in addition to the die temperature of the monitor. In addition, the monitor 201 can control discharge or charge transfer between cells in the group. The second processor module 202 monitors all cell group voltages and temperatures and uses that information to command the discharge or charge transfer between cells in each cell group 201. Up to 16 cell groups can be connected together and controlled with a single processor module 202. In this implementation the third controller module 203 communicates with the processor module through an electrically isolated CAN communication module, however this communication method is not required. Any conductive, opto-isolated, or magnetically coupled physical communication method can be used to communicate via CAN, RS-485, or some other multi-master communication standard known to masters of the art. This communication master controller 203 can be linked with as many cell group controllers 202 as is available via the standard; in this implementation the controller 203 is connected to 6 or 8 cell group controllers 201. Each battery module may include a Local Module Unit which is a board further described below.

Cell balancing at the cell group module level can be implemented in a number of ways. In one implementation the cell group module 201 may be commanded by the cell group controller 202 to discharge cells at up to 20 W of power per cell, for example. Heat is dissipated through the circuit board and can also be transferred into a heatsink for a faster discharge rate. Removing energy at a high rate enables the battery cells within the module 201 to balance very quickly. Instead of discharging cells into resistors and creating heat, charge balancing can be done via a charge shuttling routine. Energy can be buffered into a capacitor or supercapacitor from one or many cells, then transferred into a single cell by using the cell group module 201 to turn on transistors moving charge into the cell. By using transistor level components rated for the maximum voltage of the module, the system can provide isolation for all cells attached through transistors to the energy storage device. If done in rapid succession, the module 201 can move energy from the overall module 201 into a specific cell resulting in a highly efficient method of balancing. Resistors can still be utilized to drop module voltages with respect to other modules. Using this method allows the cells controlled by the cell group controller 202 to balance fully, and by using intelligent controls, can balance every cell connected to the large network connected to the Energy Storage Master Controller 203. A third balancing possibility would be to use an isolated DCDC converter attached at the module level that could charge an individual cell based on transistor switching at any one cell on the module.

Other BMS systems, have a number of faults which are addressed by embodiments of the present invention. For example, other BMS systems may require a significant number of wires (e.g., 144 per pack) which can result in extra assembly work, large wiring harnesses, more failure points, and added weight. In addition, other BMS systems often have insufficient voltage resolution which may not be sufficient to balance individual cells with nominal voltages of 2.3V. Lastly, other BMS systems may be inadequate for fast charging of energy storage systems at 6 C rates. In particular, active balancing of cells during charge events may not be able to be achieved.

By utilizing a multi-cell battery stack monitoring microprocessor chip, for example LT-6802-1 from Linear Technology, the complexity of writing required may be greatly reduced. Thus, less wiring may be required to gather data from groups of cells and send consolidated information from each cell and module which can be aggregated back to the energy storage master for decision making. A multi-cell battery stack monitoring microprocessor chip may be used as the central processor on the Local Module Unit. This may enable a simplification of the BMS which may allow removal of excess wiring (e.g., the removal of 140 wires per pack). Voltage resolution may also be improved, for example, with overall string voltage and current with selectable cell voltages at a high resolution of +/−0.05V.

Use of a multi-cell battery stack monitoring microprocessor chip, for example LT-6802-1 from Linear Technology, may have several benefits including: enabling fast charging at 6 C rates, active balancing during fast charging at 6 C rates, using 20 W bleed resistors per cell versus 1 W typical. Other benefits may include: humidity or water detection in battery packs (may aid in detection of compromised integrity of back pack enclosures and may provide advanced warning of potential field issues), efficient cell balancing (shuttling energy between cells versus resistive dissipation of heat), and bypass capability per cell to allow limp home mode (providing emergency power to limp home under derated conditions, and where an intermittently functioning cell would typically trigger the pack to be taken offline line, an intermittent cell could be bypassed allowing some power from the pack to be used for vehicle propulsion).

Thus, a multi-master implementation may control battery groups independently and send information about the pack to the Energy Storage Master and the rest of the battery groups. The information that is distributed between the controllers can be used for purposes such as energy tracking, verification of sensor feedback, and distribution of battery group information to allow balancing and management between groups. The Energy Storage Master controller can utilize battery group information such as State of Charge, Current, Voltage, Temperature, and other relevant information to interface with chargers or vehicle controllers. For example, if a short is ever detected through the BMS, the system may disconnect each sub-pack in the string where the fault is detected and that will isolate the fault. Thus, the BMS further ensures a level of safety which is necessary in the event of a major crash or failure of the isolation system.

Thus, an integrated BMS may enable cell monitoring, temperature monitoring, cell balancing, string current monitoring, and charger control integration. The BMS may be integrated into battery packs to give early warning to potential problems with weaker battery cells within the string of a battery back. The BMS may give feedback on cell voltages and temperatures within the battery modules in order to ensure a healthy battery pack.

Figure 3:
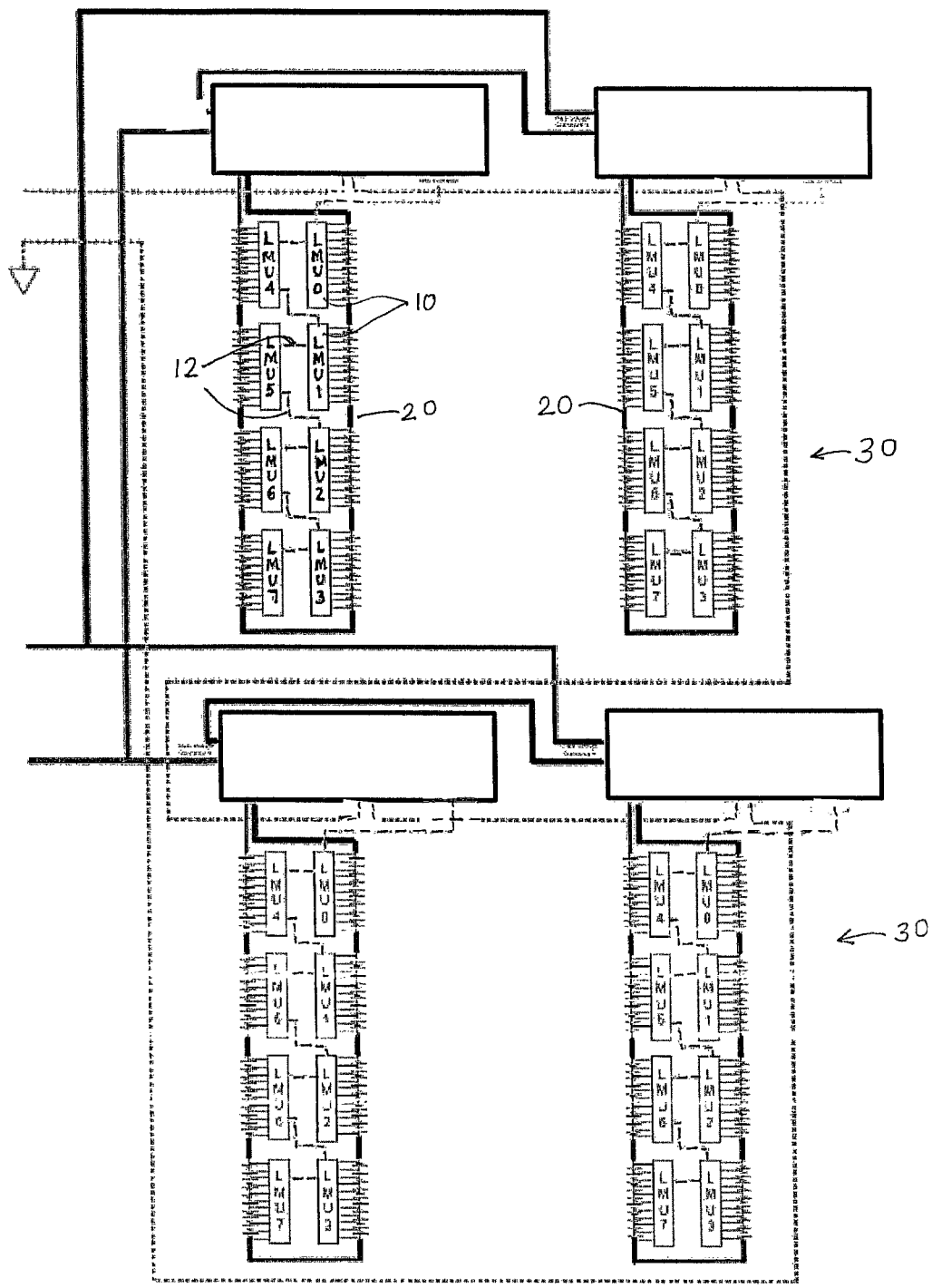
FIG. 3 illustrates examples of arrangements and interconnections within packs and strings, in accordance with embodiments of the invention.

Referring to FIG. 3, examples of arrangements and interconnections within packs and strings are shown. The power connections in a string 30 may consist of two packs 20 in series and those series packs may be paralleled with two other packs. Each pack may consist of eight Local Module Units 10 connected in series. Each Local Module Unit may balance ten battery cells also connected in series. Each cell may have a nominal voltage of 2.3V or some other nominal voltage relating to lithium chemistry batteries. The cell voltage can range from 2.0V to 2.8V depending upon its state of charge and whether it is being charged or discharged. Nominal system voltages are therefore 23V per Local Module Unit 10, 184V per pack and 368V per string. Maximum voltages are 28V per Local Module Unit 10, 224V per pack and 448V per string 30. All power should be (but does not necessarily need to be) isolated from the vehicle chassis. The Local Module Units 10 may be connected together to communicate with each other using standard communication protocols. For example, the SPI communication protocol 12 may allow all of the Local Module Units to communicate at the same time. Further, each Local Module Unit may have an address to identify whether that Local Module Unit should communicate with the Pack Master.

In one embodiment, the electronic assemblies may be designed such that there is sufficient design margin to account for component tolerances and the manufacturer's specifications are not be exceeded. With respect to electrical maximums, in one embodiment, the pack level maximum voltage is 224 VDC, the string level maximum voltage 448 VDC, and the pack level maximum operating current range is −1200 ADC to 1200 ADC.

In one embodiment, signal and low power wiring will be selected to meet the following table:

| AWG | ohms/kft | Max current A |
| --- | --- | --- |
| 12 |  | 20 |
| 14 |  | 15 |
| 16 |  |  |
| 18 |  |  |
| 20 | 10.15 | 11 |
| 22 | 16.14 | 7 |
| 24 | 25.67 | 3.5 |
| 26 | 40.81 | 2.2 |
| 28 | 64.9 | 1.4 |
| 30 | 103.2 | 0.86 |

Each connection may have its maximum expected current specified so that the appropriate wire gauge and connector pin ratings can be easily determined. Further, in one embodiment, any wiring that is not off the shelf may be 18 AWG or larger.

In one embodiment, high power wires are selected to meet the following table:

| length in feet for total circuit for secondary voltages only - do not use this table for 600 Volt in-line applications | | | | | | | |
|---|---|---|---|---|---|---|---|
| AMPS | 100' | 150' | 200' | 250' | 300' | 350' | 400' |
| 100 | 4 | 4 | 2 | 2 | 1 | 1/0 | 1/0 |
| 150 | 4 | 2 | 1 | 1/0 | 2/0 | 3/0 | 3/0 |
| 200 | 2 | 1 | 1/0 | 2/0 | 3/0 | 4/0 | 4/0 |
| 250 | 1 | 1/0 | 2/0 | 3/0 | 4/0 | | |
| 300 | 1/0 | 2/0 | 3/0 | 4/0 | | | |
| 350 | 1/0 | 3/0 | 4/0 | | | | |
| 400 | 2/0 | 3/0 | | | | | |
| 450 | 2/0 | 4/0 | | | | | |
| 500 | 3/0 | 4/0 | | | | | |
| 550 | 3/0 | 4/0 | | | | | |
| 600 | 4/0 | | | REQUIRED CABLE SIZES SHOWN IN AWG NUMBERS | | | |

The total circuit length includes both welding and ground leeds (Based on 4-Volt drop) 60% duty cycle.

In one embodiment, the bus bar may be 1/8" by 1" cross section or larger.

With respect to timing, in one embodiment, a fault is detected in 500 mS or less. The 500 mS determination is based on a communications failure happening, and waiting 5× the communications data rate before triggering a fault. In this embodiment, this is expected to be the longest time for a failure to be detected so as to prevent damage to batteries by heat, voltage (under/over), and current.

In one embodiment, the contactor must be opened within 500 mS after a fault is detected and response to commands must occur in 300 mS (100 ms Pack Master (PM) to EMC), 100 mS Energy Storage Master (ESM) to Vehicle Master Controller (VMC), and 60-75 mS VMC to contactor).

In one embodiment, the CAN communicates at 125 kbps, which impacts the maximum bus length per the table below.

| Bit Rate | Bus Length | Nominal Bit-Time |
|---|---|---|
| 1 Mbit/s | 30 m | 1 µs |
| 800 kbit/s | 50 m | 1.25 µs |
| 500 kbit/s | 100 m | 2 µs |
| 250 kbit/s | 250 m | 4 µs |
| 125 kbit/s | 500 m | 8 µs |
| 62.5 kbit/s | 1000 m | 20 µs |
| 20 kbit/s | 2500 m | 50 µs |
| 10 kbit/s | 5000 m | 100 µs |

The cable length of stub may be limited to 1 meter. The system may monitor all cell voltages, currents and temperatures, and bleed off excess voltages in the form of radiated heat. Noise from several possible on-board sources such as Traction Motor/Controller 12.5 kHz, VFD's ~4 kHz, etc. may be handled such that they do not cause non-operation. In some embodiments, this may be accomplished by way of Galvanic Isolation at levels up to 2500 VDC. Voltage spikes from the charging system with primary fundamental at 7 kHz with first harmonic at 14 kHz also do not disable the system. In some embodiments, this may be accomplished by way of Galvanic Isolation at levels up to 2500 VDC at the Local Module Unit and CAN transceiver.

In one embodiment, the system may incorporate electronics which meet AEC-Q200-REV C and AEC-Q101-REV-C Automotive Grade requirements from −40 C to +125 C. To meet safety standards, all high voltage arrays may be clearly labeled and the system may not have any exposed voltages over 35V. It may be desired that a differential temperature between any packs be less than 20 C. This could be an indication of some sort of cell imbalance or failure. Upper string and lower string are expected to have differences exceeding this amount, so only packs within the same string may be compared. The maximum charging current may be up to 1,100 A for the entire bus and not to exceed 325 A per pack. The opening of overhead emergency hatches may disable charging.

Figure 4:
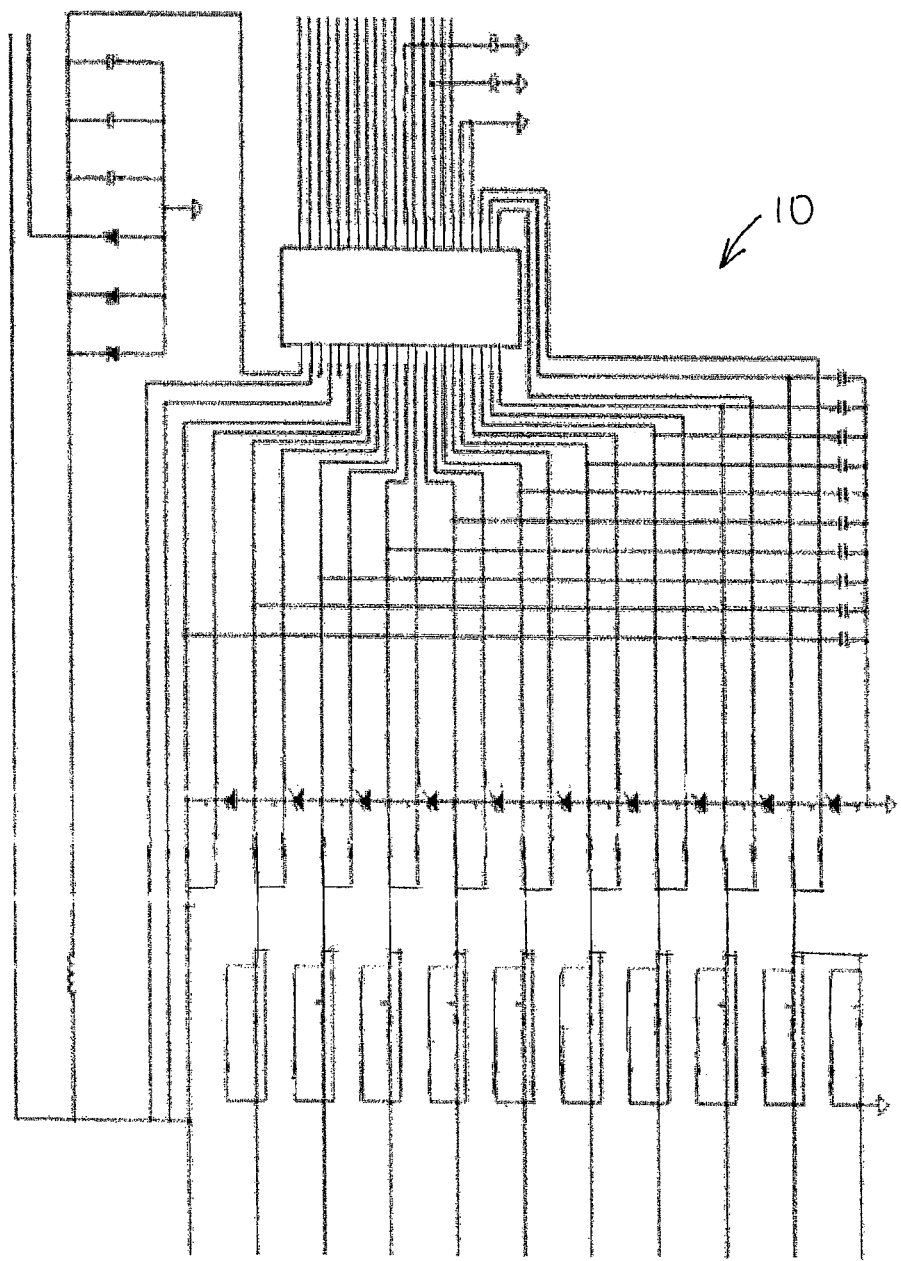
FIG. 4 illustrates one example of circuitry used to implement a Local Module Unit, in accordance with embodiments of the invention.
Figure 5:
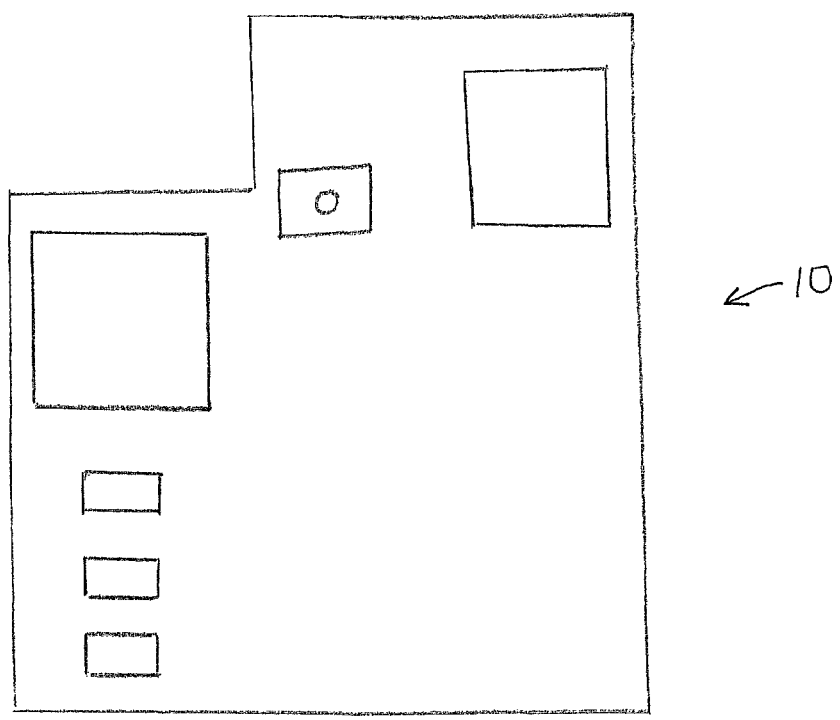
FIG. 5 illustrates an example of the layout of a Local Module Unit, in accordance with embodiments of the invention.

FIG. 4 illustrates one example of circuitry used to implement a Local Module Unit 10. In FIG. 5, an example of the layout of a Local Module Unit 10 is shown. FIG. 5 illustrates one layer of a prototype Local Module Unit board 10. This board may be used to monitor cell voltages and temperatures at the module level and report information about the module to a microcontroller. In some instances, the microcontroller may be located on the Local Module Unit itself and may report higher level information to another microcontroller.

Figure 6:
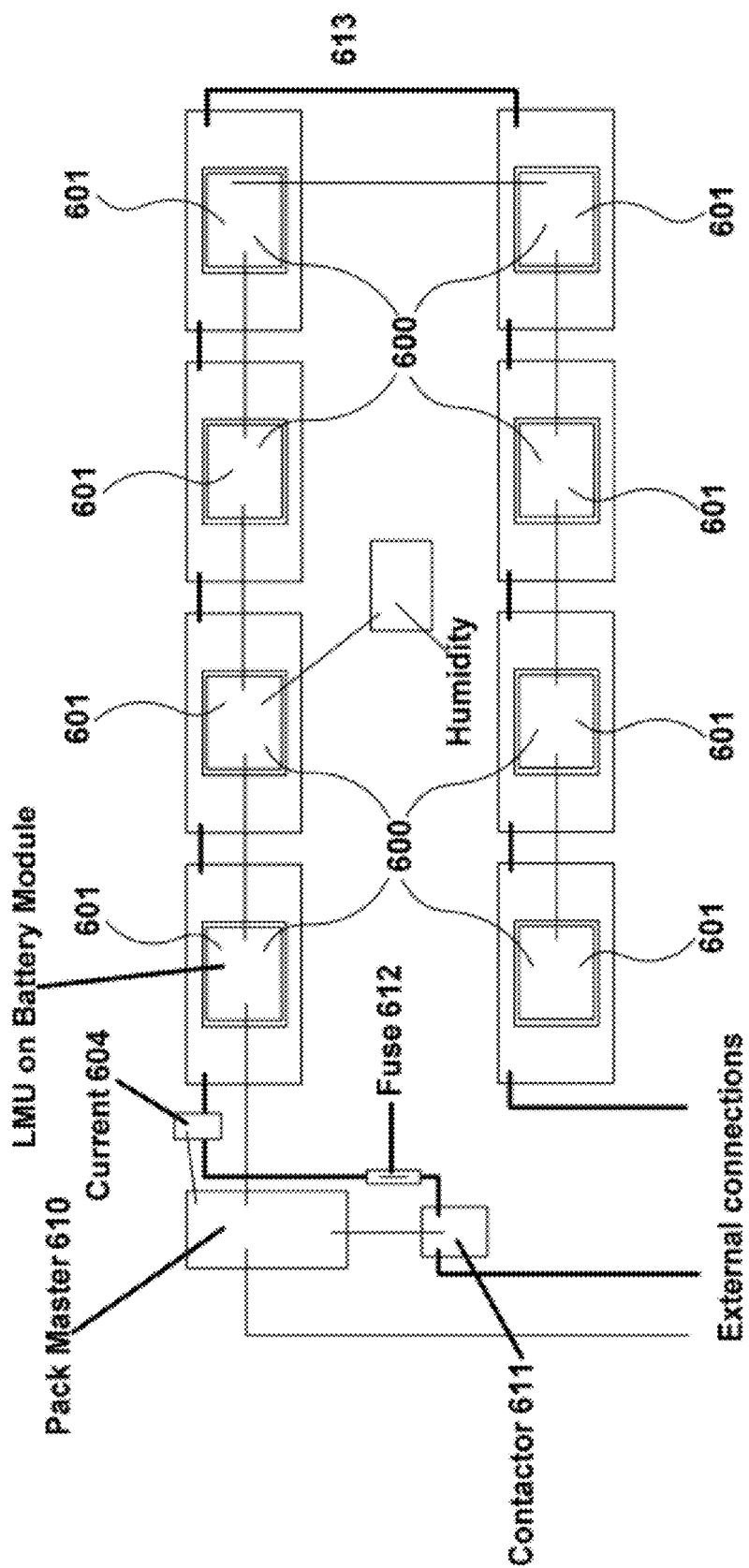
FIG. 6 illustrates an example of the architecture through which the Vehicle Master Controller interfaces with the Energy Storage Master to control operation of battery packs, in accordance with embodiments of the invention.

Vehicle Master Controller:

Referring to FIG. 6, an example of the architecture through which the Vehicle Master Controller interfaces with the Energy Storage Master to control operation of battery packs is illustrated. The Vehicle Master Controller may interface with the Energy Storage Master which may receive aggregated data from each of the battery packs through Pack Master Boards on each battery pack. Each pack may have its own BMS and therefore may operate as a complete unit independently from other packs, but may also integrate with a master controller to provide greater overall functionality, such as functionality that may be achieved through aggregation and consolidation of information to the Vehicle Master Controller.

In one embodiment, as shown in FIG. 6, each battery module 600 may have a Local Module Unit 601 which feeds data to a Pack Master 610. The Pack Master 610 may then send aggregated data back to an Energy Storage Master which may interface with a Vehicle Master Controller. The energy storage master unit may communicate with all Pack Master units 610, a bus controller, and a curbside charger(s), and may keeps track of voltage, current 604, temperature, humidity, state of charge (SOC) and state of health (SOH) for all cells within each of the battery modules 600. Thus, each pack may be addressable and may be queried as to the health and status at any time. If there is ever a problem with an individual battery cell, an entire string may be automatically removed from service to allow the vehicle to continue operating in a reduced capacity mode until a vehicle returns from operation. The Energy Storage Master controller may provide information to the Vehicle Master Controller when necessary and may create a user-friendly energy storage interface to the vehicle. Thus, it may be possible to have greater visibility into the operation of the vehicle.

To accomplish the communication, each battery pack may have a BMS harnessing, BMS boards that maintain the cells attached to each battery module 600, a contactor 611 and a fuse 612. All of the modules 600 may be connected in series with a bus-bar 613 and may be secured in place and contact a heat-sink along the back side which may flow coolant through the vehicle electrical cooling system. The cooling system may remove the heat radiated from the road surface and may additionally help to reject a small amount of heat generated by the battery cells and electrical connections. The BMS, contactor 611 and fuse 612 may have a compartment at the end for the pack that is accessible from underneath or the top of the pack in the event that a repair is necessary.

In one embodiment, the Vehicle Master Controller (VMC) may be responsible for receiving the battery data from the Energy Storage Master, displaying state of charge and other battery information to a vehicle operator, and controlling the status of the contactors based on data received from the Energy Storage Master. When a contactor 611 is open, it may mean that it is disabled and not making a connection, and when a contactor 611 is closed, it may mean that it is enabled and connected. If the contactor 611 is off, it may be based on local warning or error signals using the CAN request to Vehicle Master Controller via the Energy Storage Master. The Vehicle Master Controller may have additional functions not related to the BMS system.

The Vehicle Master Controller may have various contactors installed in the vehicle—(1) HV contactors (precharge, HV+, HV−), (2) battery contactors (string 1, string 2, string 3, string 4), (3) overhead charge contactors (AutoChg+, AutoChg−), and manual charge contactors (ManChg1+, ManChg1−, ManChg2+, ManChg2−).

Error conditions may result in a CAN message request for the pack contactor 611 to open or disconnect. Some conditions may result in a request for the contactor 611 to open immediately. For example, if voltage in excess of 440 Volts for a bus (equivalent to 220 Volts per pack) is detected, the following contactors may be opened as quickly as possible in the following order, and the operator may be notified of a serious fault: (1) open charge contactors, (2) open HV contactors, and (3) open battery contactors. As another example, if the current is in excess of 350 Amps, either charging or discharging, and this condition has existed continuously for five seconds, a request may be made to open the contactor for the string exceeding this limit. In another example, if the temperature is in excess of 65 degrees Celsius, a request may be made to open a string contactor and notify the operator of a fault.

Various warning conditions may be reported in a CAN message. These conditions may result in a contactor being opened, but a determination may be made by the EMC or Vehicle Master Controller based on the information provided by the Pack Master 610. Along with the warning messages, the system may work to respond to a problem or correct a problem, for example, by cell balancing. Warning messages and system responses may include the following:

(1) Voltage in excess of 430V for the vehicle (equivalent to 215V per pack): Vehicle shall terminate charging and open the charge contactors between 500 mS and 1.5 S after detection of over-voltage condition;

(2) Under-voltage: Normal operation shall continue. No warnings will be provided. State of charge should be an indicator of this warning;

(3) Voltage imbalance: If any two strings are within 10V of each other, they can be connected. If there is a greater than 10V or 10% SoC difference between two strings, connect only the string contactor for the higher voltage of SoC. Report lower performance to driver while the strings are disconnected. When the higher voltage or SoC string depletes to the point where it is within 10V of another string, the other string can be connected;

(4) Current imbalance: For a measured Current Imbalance (at the Energy Storage Master Level) of greater than 100 A between strings, the string that is different shall: (a) If overall string current is ±20 A, request string disable. (b) If overall string current is greater than ±20 A; do not disable and indicate a Warning Flag to the operator;

(5) Temperature in excess of +58 C: The operator shall be notified of a temperature warning, and the charge and discharge shall be derated according to the following limits: 70% of nominal for temperatures from −30 C to 70 C and SOC from 0 to 100%, 50% of nominal for temperatures from −30 C to 70 C and SOC from 0 to 100%, and 0% of nominal for temperatures from −30 C to 70 C and SOC from 0 to 100%. In practice, any derating may be achieved with the system simply by programming the cutoff limits in a lookup table. This may be useful for derating the pack based on temperature of the cells to prevent damage;

(6) Temperature below −25 C: Normal operation will be allowed. It is expected that during operation, the cell temperatures will increase;

(7) Lose Pack Contactor/Battery Cell/Battery Error: The problem string contactor will be commanded to open. The contactor will remain open until the condition no longer exists;

(8) Lose more than 1 string: All of the problem string contactors will be commanded to open. The contactor will remain open until the condition no longer exists. The driver shall be informed of the warning;

(9) Loss of communications with Energy Storage Master: Keep contactors connected. Indicate yellow alarm at dash;

(10) Loss of communications with Pack Master(s): Keep contactors connected. Indicate yellow alarm at dash;

(11) Master Switch turned off while charging: The following events must occur in sequence: (a) Disable Charging, (b) Disable Charger Contactors, (c) Disable HV Contactors, and (d) Disable Battery Contactors;

(12) Emergency Hatch Open: The following events must occur in sequence: (a) Disable Charging, (b) Disable Charger Contactors, (c) Display screen text, "Hatch Open! Close hatch & re-dock to continue charging," and (d) Latched off until vehicle movement;

(13) Vehicle Movement while charging: The following events must occur in sequence: (a) Disable Charging, and (b) Disable Charger Contactors;

(14) Fused Contactors: A secondary detection method may be used for warning.

During normal operation, when no faults have been detected, the contactors may be configured as follows during each of the operation states of the vehicle:

(1) Vehicle Powered Off: All Contactors Open;

(2) Vehicle Overhead Charging: HV Contactors Closed, Battery Contactors Closed, Overhead Charge Contactors Closed;

(3) Vehicle Manual Charging, Port 1: ManChg 1±Closed, HV Contactors Closed, Battery Contactors Closed;

(4) Vehicle Manual Charging, Port 2: ManChg 2±Closed, HV Contactors Closed, Battery Contactors Closed, Overhead Charge Contactors Open; and (5) Vehicle Running: HV Contactors Closed, Battery Contactors Closed, Manual Charge Contactors Open, Overhead Charge Contactors Open.

Figure 7A:
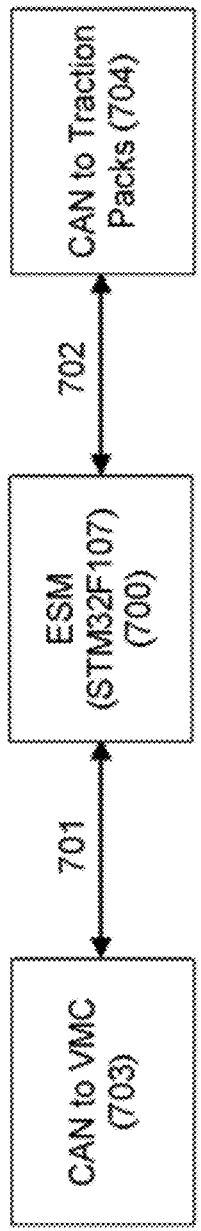
FIG. 7A illustrates an example of a block diagram of an Energy Storage Master's connections, in accordance with embodiments of the invention.

Energy Storage Master (ESM) Unit:

Referring to FIG. 7A, an Energy Storage Master's connections block diagram is shown. The Energy Storage Master 700 may have several capabilities. Its main function is to interpret Vehicle Master Controller commands to and from the Pack Masters (via connections 701 and 702). It also collects a database for display to the Vehicle Master Controller for High/Low/Average Voltage, SOC, SOH, and High/Low/Average temperatures for the Traction Packs. It keeps track of which cell has Temperature or Voltage extremes. It also has the ability to interface with the Fast Charge System relating required Voltages and Currents indicated by SOC.

Figure 7B:
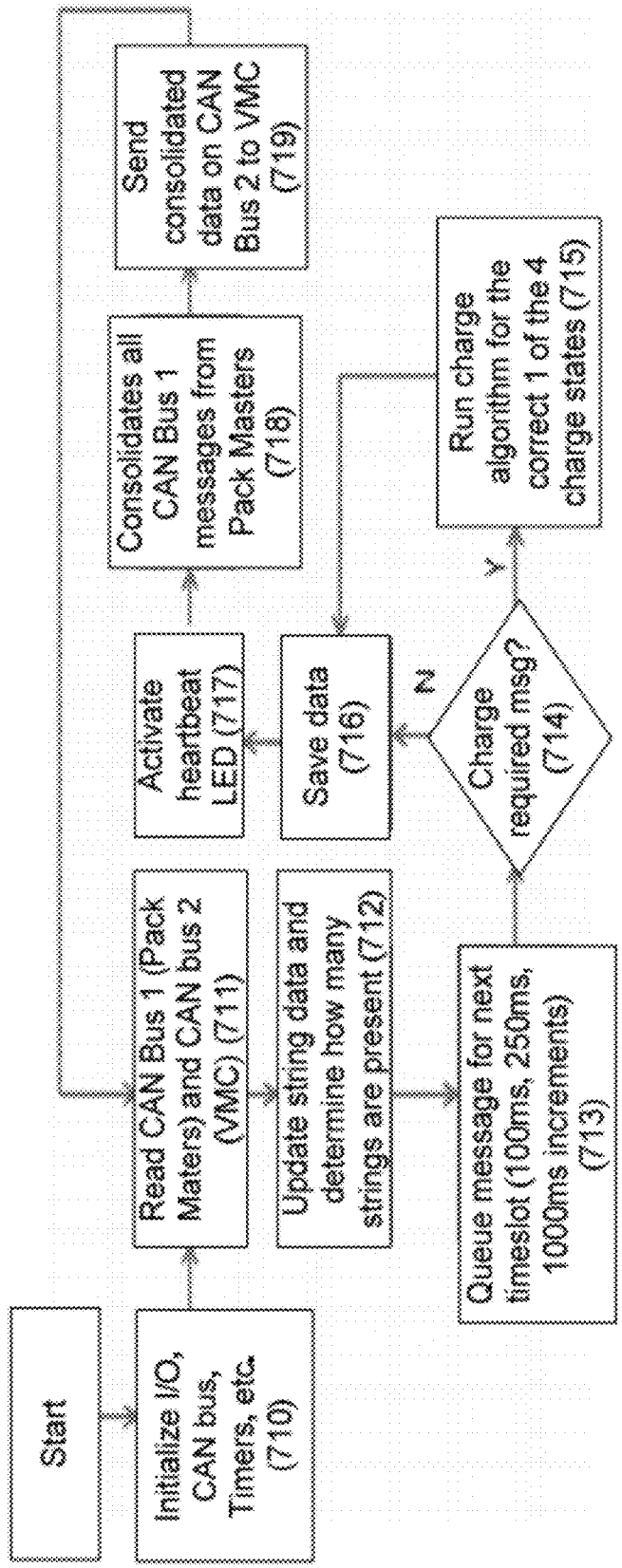
FIG. 7B illustrates a flowchart of an example of behavior of an Energy Storage Master, in accordance with embodiments of the invention.

Referring to FIG. 7B, the Energy Storage Master: (1) receives and decodes messages from the Pack Master (711), (2) encodes and transmits messages to the Pack Master (718), (3) receives and decodes messages from the Vehicle Master Controller (711), (4) encodes and transmits messages to the Vehicle Master Controller, (5) consolidates all messages from Pack Masters and send data to the Vehicle Master Controller (719), (6) updates string data and determines how many strings are present (712), (7) determines if charge mode is requested (714), and (8) runs a charge algorithm for the correct one of four available charge states (715).

The Energy Storage Master may run on an internal loop for sending CAN bus messages. For example, the Energy Storage Master internal main loop may run on a 100 ms, 250 ms, and 1000 ms period for sending CAN bus messages, and the messages therefore may be sent at the following times each second: 100 ms, 200 ms, 250 ms, 300 ms, 400 ms, 500 ms, 600 ms, 750 ms, 800 ms, 900 ms and 1000 ms. FIG. 7B illustrates a behavioral block diagram for the actions of the Energy Storage Master.

In one embodiment, connectors and pinouts for the Energy Storage Master may be as follows:
Interface Name: ESM CAN
The cable harness that connects to this interface is XCAN.
Connector PN: Deutsch DT 06-3S

TABLE 1

ESM CAN Bus Pin Out

| Pin | Signal | Description | Current | Voltage | Isolation |
|---|---|---|---|---|---|
| A | CAN Hi | Blk | 10 mA | 5 V | 500 Vcont |
| B | CAN Low | Red | 10 mA | 5 V | 500 Vcont |
| C | Shield | Shield | 10 mA | +/−0.3 V | |

Interface Name: ESM Power
The cable harness that connects to this interface is TBD.
Connector PN: Omron S82S-7705

TABLE 2

5 V ESM Power Pin Out

| Pin # | Signal | Description | Current | Voltage | Twisted |
|---|---|---|---|---|---|
| VIN | 5VDC | 5 V (Pink) | 400 mA | 24 V | |
| GND | GND | Ground (White) | 400 mA | 24 V | |

Figure 8:
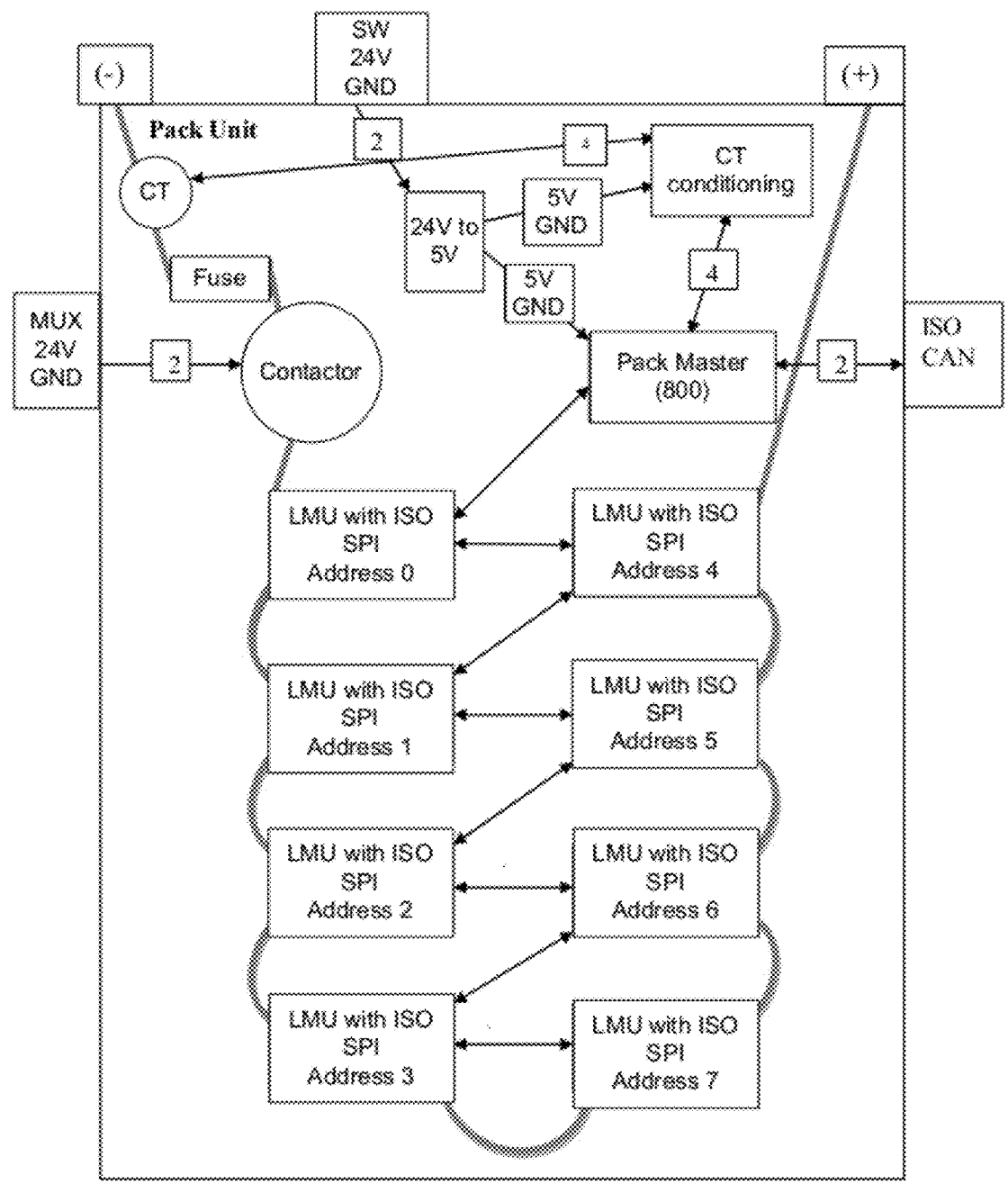
FIG. 8 illustrates a block diagram for an example of a Pack Master Unit, in accordance with embodiments of the invention.

Pack Master Unit:

FIG. 8 illustrates a block diagram for an example of a Pack Master Unit 800. In one embodiment, the Pack Master Unit 800 has several capabilities and its primary function is to provide power as half of a string of battery cells. In one embodiment, the position of the Pack Master Unit 800 as the upper or lower unit in a string is interchangeable. The Pack Master Unit 800 may also monitor all Cells located inside Battery Module units and alert the Energy Storage Master if certain operation limits are exceeded. The Pack Master Unit 800 may communicate with the Energy Storage Master via CAN message protocols. The Pack Master Unit 800 may communicate to Local Module Units via SPI from the Pack Master to the Local Module Unit. The micro controller may utilize a JTAG programming interface or any other programming interface known to experts in the art. Optimally, a bootloader program may be loaded to the Pack Master Unit which allows programming via the communication CAN bus.

Figure 9:
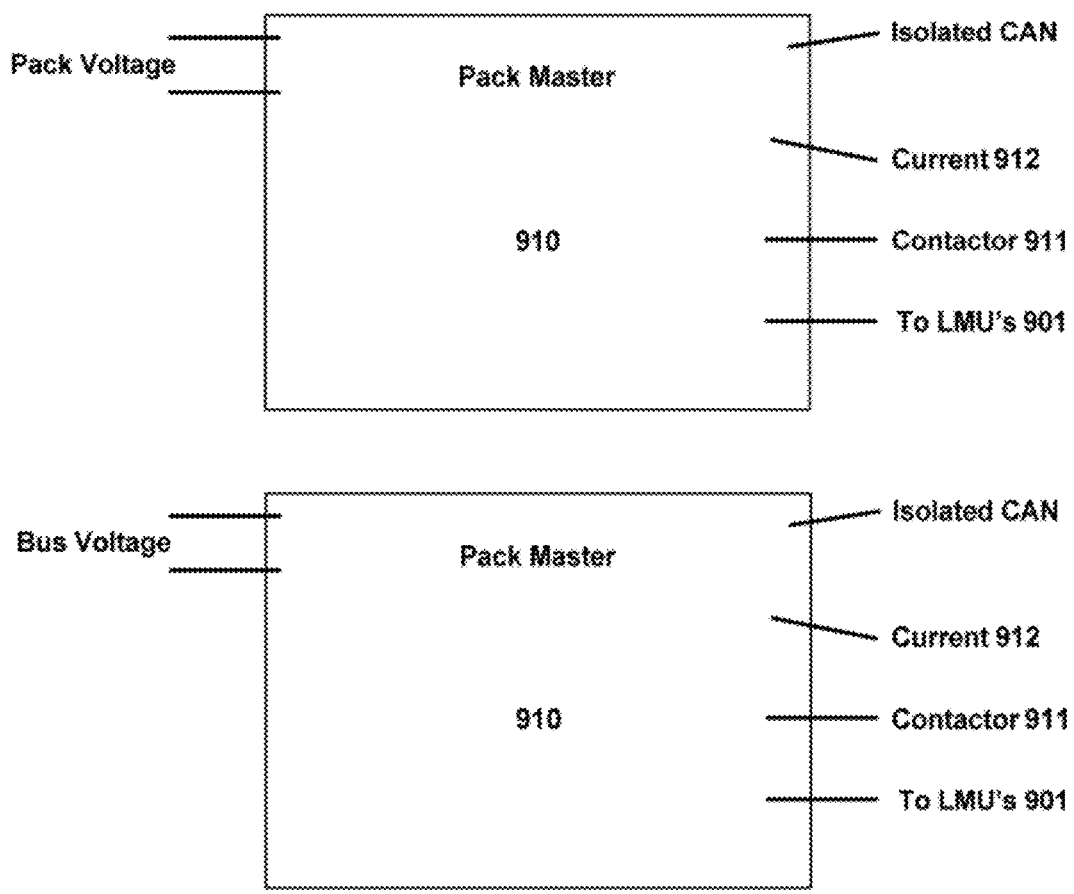
FIG. 9 illustrates an example of an architecture for a Pack Master Unit, in accordance with embodiments of the invention.

Referring to FIG. 9, a pack master unit 910 may convert pack power (50-240 VDC) to 24-28 VDC for a contactor and 3-5 VDC for pack master 910, communicates to Local Module Units 901 inside of the pack, controls contactor 911 inside pack for pack power externally enabled/disabled, monitors individual cell voltages and command shunt to bleed resistor if required, monitors temperature inside individual battery modules, monitors humidity inside the pack, monitors pack current 912 (+−30 A, +−300 A), and galvanically be isolated from anything external to the pack.

Figure 10:
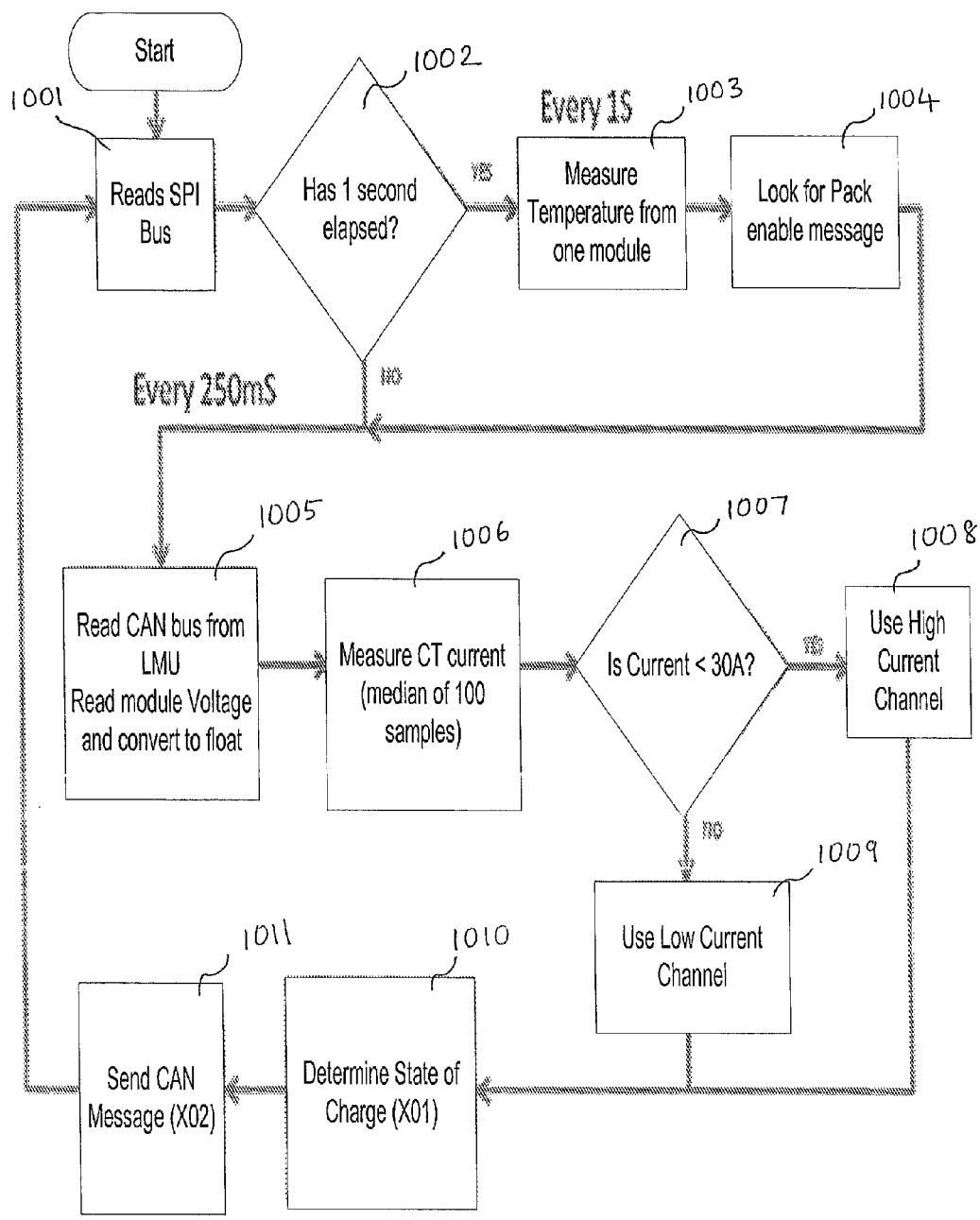
FIG. 10 illustrates an example of a flowchart illustrating behavior of a Pack Master Unit, in accordance with embodiments of the invention.

In FIG. 10, an example of a flowchart illustrating behavior of a Pack Master Unit is illustrated. In step 1001, the SPI Bus is read. If 1 second has elapsed in step 1002, then the temperature is measured from one module in step 1003. In step 1004, the Pack Master Unit may check for a Pack enable message. Every 250 mS, in step 1005, the CAN bus is read from the LMU and the module Voltage is read and converted to float. In step 1006, the measure of the Current Transducer is taken over a median of 100 samples. If the current is less than 30 A in step 1007, in step 1008 the Pack Master Unit may use a high current channel. Otherwise, the Pack Master Unit may use the low current channel in step 1009. In Step 1010, the Pack Master Unit may determine State of Charge using open circuit voltage if the current is less than a certain threshold. Otherwise, the Pack Master Unit may determine State of Charge using a Coulomb count. In step 1011, the Pack Master Unit may enable the contactor using CAN request to Vehicle Master Controller via the Energy Storage Master.

In one embodiment, voltage ranges for the Pack Master Unit range from 5 VDC+−30 mV, from Isolated Power Supply Unit (V-Infinity PTK15-Q24-S5-T or equivalent. For the SPI: 5.0 VDC TTL level, CAT 5e non-shielded connector. With respect to isolation, in one embodiment 500V continuous isolation and in one embodiment, 2500V peak isolation (i.e. continuous and intermittent short bursts). There may be two primary software loops, one running every 250 mS and the other running every 100 mS, for example.

In one embodiment, connectors and pinouts for the Pack Master Unit may be as follows:
Internal Interfaces
Interface: Pack Signal
The external pack signal cable is a custom cable that connects each pack master to the junction box.
Connector PN: Harting 0914002 2751
Mate Connector PN: Hailing 0914002 2651

TABLE 3

External Pack Signal Pin Out

| Pin # | Signal | Description | Current | Voltage | Isolation | Twisted |
|---|---|---|---|---|---|---|
| 1 | 24 V SW | 24 V Switched | 400 mA | 24 V | | |
| 2 | GND | Ground, 24 V return | 400 mA | +/−0.3 V | | |
| 3 | Contactor+ | Contactor control positive | 1.5 A pk | 28 V | | |
| 4 | Contactor− | Contactor control negative | 1.5 A pk | 28 V | | |
| 5 | CAN A | CAN bus signal A | 10 mA | 5 V | 500 Vcont | |
| 6 | CAN B | CAN bus signal B | 10 mA | 5 V | 500 Vcont | |
| 7 | Shield | Shielding | | +/−0.3 V | | |
| 8 | Case GND | Chassis ground | | +/−0.3 V | | |

The external pack signal connector will connect to four different connectors in the pack master through the internal pack Y cable.
Interface: 24V Pack Power Supply Module
24V is supplied to the pack power supply module. Pack Y cable mate.
Connector PN: DT06-4S
Mate Connector PN: DT04-4P

TABLE 4

24 V Pack Power Supply Module Pin Out

| Pin # | Signal | Description | Current | Voltage | Twisted |
|---|---|---|---|---|---|
| 1 | GND | Ground | 400 mA | 28 V | |
| 2 | 24 V SW | 24 V Switched | 400 mA | 28 V | |
| 3 | | Unused | | | |
| 4 | | Unused | | | |

Interface: 5V PackMaster Power
24V is supplied to the pack power supply module. Pack Y cable mate.
Connector PN: DT06-2S
Mate Connector PN: DT04-2P

TABLE 5

5 V PackMaster Power

| Pin # | Signal | Description | Current | Voltage | Twisted |
|---|---|---|---|---|---|
| 1 | GND | Ground | 400 mA | 5 V | |
| 2 | 24 V SW | 24 V Switched | 400 mA | 5 V | |

Interface: Contactor Control
24 to 28V, 1.5Apk for 32 ms transition and 0.1 A hold current for a Gigavac GX15. Pack Y cable mate.
Connector PN: Spade
Mate Connector PN: Spade Recept.

TABLE 6

Contactor Control Pin Out

| Pin # | Signal | Description | Current | Voltage | Twisted |
|---|---|---|---|---|---|
| | Coil+ (red) | Contactor control positive | 1.5 A pk | 28 V | |
| | Coil− (black) | Contactor control negative | 1.5 A pk | 28 V | |

Interface: Pack Master CAN
The cable harness that connects to this interface is XCAN. Pack Y cable mate (Deutsch DT04-3P).
Connector PN: Deutsch DT 06-3 S
Mate Connector PN: Deutsch DT04-3P

TABLE 7

Pack Master CAN Bus Pin Out

| Pin | Signal | Description | Current | Voltage | Isolation |
|---|---|---|---|---|---|
| A | CAN Hi | Blk | 10 mA | 5 V | 500 Vcont |
| B | CAN Low | Red | 10 mA | 5 V | 500 Vcont |
| C | unused | | | | |

Interface: Case Ground
This is attachment to case on the pack master. Pack Y cable mate.
Connector PN: Ring Term.
Mate Connector PN: Bolt

TABLE 8

Pack Master Case GND Pin Out

| Pin # | Signal | Description | Current | Voltage |
|---|---|---|---|---|
| | Case GND | Case ground | 400 mA | +/−0.3 V |

Interface: Pack Master SPI
The cable harness that connects to this interface is CAT5e.
Connector PN: AMP 43860-0001
Mate Connector PN: RJ45 style

TABLE 9

Pack Master SPI Communication Pin Out

| Pin # | Signal | Description | Current | Voltage | Isolation | Twisted |
|---|---|---|---|---|---|---|
| 1 | CS | SPI Chip Select | 10 mA | 5 V | 500 Vcont | Pair 3 |
| 2 | MISO | SPI master in slave out | 10 mA | 5 V | 500 Vcont | Pair 3 |
| 3 | MOSI | SPI master out slave in | 10 mA | 5 V | 500 Vcont | Pair 2 |
| 4 | SCK | SPI clock | 10 mA | 5 V | 500 Vcont | Pair 1 |
| 5 | GND | Ground | 120 mA | +/−0.3 V | 500 Vcont | Pair 1 |
| 8 | NC | No Connect | | | | Pair 4 |
| 7 | NC | No Connect | | | | Pair 4 |
| 6 | 5 V | Power | 120 mA | 5 V | 500 Vcont | Pair 2 |

Analog Signal Connectors

Two current transformers (CT) may be used to measure the current in and out of the pack master. One may be scaled for 0 A-30 A measurement and the other 0 A-350 A measurements.

Interface: CT Pre-Conditioning

The CT Pre-Conditioning connector connects to the hall effect sensors for current monitoring.

Connector PN: Delphi PA6-GB20

Mate Connector PN: Delphi PA66-GF25

TABLE 10

CT Pre-Conditioning Pin Out

| Pin # | Name | Description | Current | Voltage | Twisted |
|---|---|---|---|---|---|
| B | 5V | Sensor Power | 100 mA | 5 V | |
| C | GND | Sensor Ground | 100 mA | +/−0.3 V | |
| D | Hall 1 | First hall −30 A to 30 A | 10 mA | 5 V | |
| A | Hall 2 | Second hall −350 A to 350 A | 10 mA | 5 V | |

High Power Connectors

The high power path may be fused at 500 Amps. 0000 AWG welding cable or copper buss bars may be selected for high current conductors. The ampacity of 4/0 welding cable may be 600 A with a temperature rise of 20 C. The fuse rating must be below the wiring rating in order for it to open before damage to the wiring occurs.

Interface: Pack Voltage

The pack voltage harness is used to connect the pack's battery voltage to other pack masters and to the junction box.

Connector PN:

Mate Connector PN:

TABLE 11

Pack Voltage Pin Out

| Pin # | Signal | Description | Current | Voltage |
|---|---|---|---|---|
| 1 | Battery+ | Positive battery voltage | 500 A | 500 V |
| 2 | Battery− | Negative battery voltage | 500 A | 500 V |

Interface: LMU Terminal

The LMU terminal is used to connect the LMU's battery voltage to the pack masters.

Connector PN: Terminals

Mate Connector PN:

TABLE 12

LMU Terminal Pin Out

| Pin # | Signal | Description | Current | Voltage |
|---|---|---|---|---|
| 1 | Battery+ | Positive battery voltage | 500 A | 220 V |
| 2 | Battery− | Negative battery voltage | 500 A | 220 V |

Interface: Fuse Terminal

The Fuse terminals are connected to the minus to fuse cable and fuse to contactor cable.

Connector PN: Terminals

Mate Connector PN:

TABLE 13

Fuse Terminal Pin Out

| Pin # | Signal | Description | Current | Voltage |
|---|---|---|---|---|
| 1 | Battery− | Negative battery voltage | 500 A | 220 V |

Interface: Contactor Terminal

The Contactor terminals are connected to the fuse to contactor cable and contactor to LMU terminal.

Connector PN: M8×1.25 Power Terminals

Mate Connector PN:

TABLE 14

Fuse Terminal Pin Out

| Pin # | Signal | Description | Current | Voltage |
|---|---|---|---|---|
| 1 | Battery− | Negative battery voltage | 500 A | 220 V |

Figure 11:
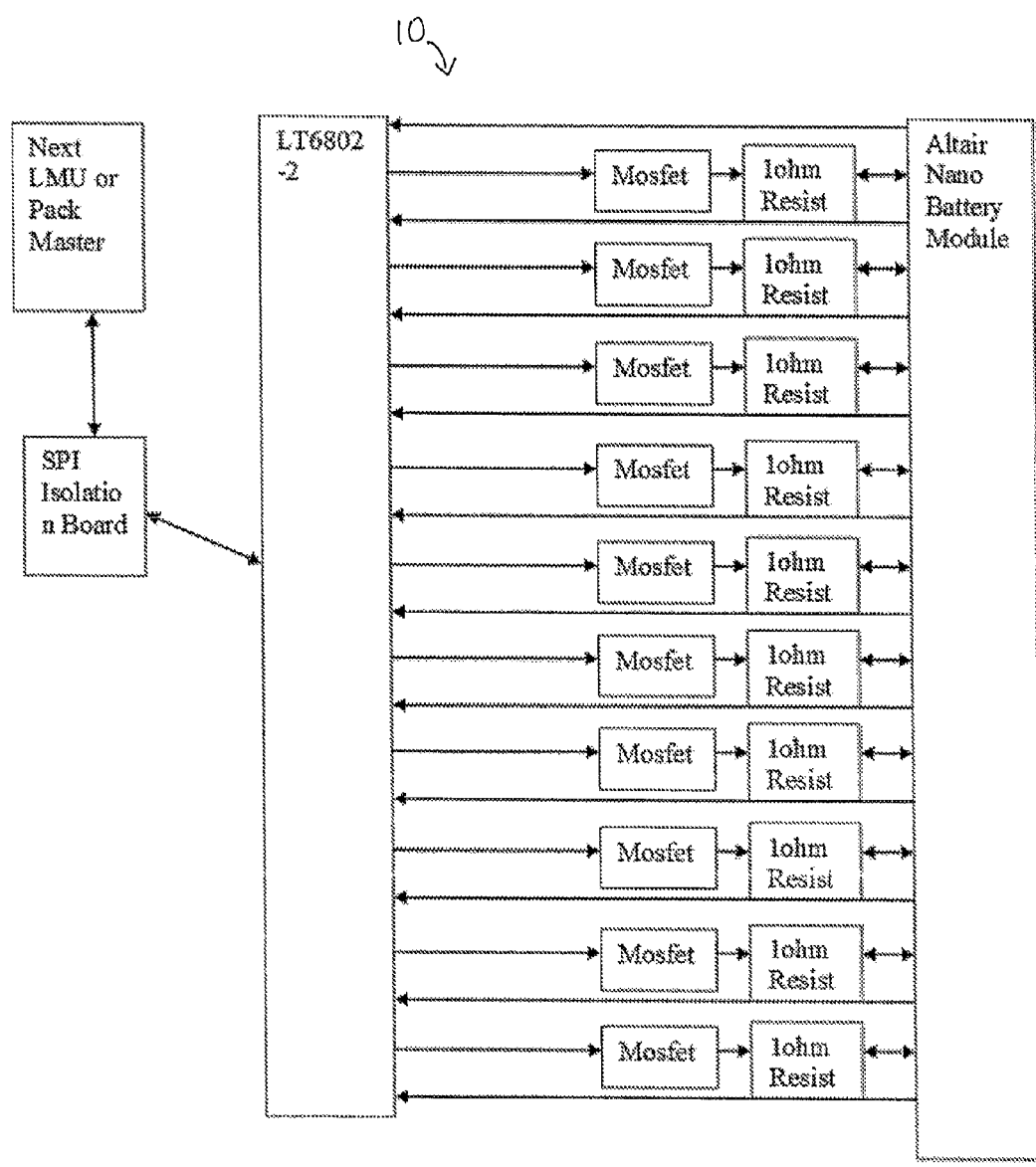
FIG. 11 illustrates an example of a block diagram of a Local Module Unit, in accordance with embodiments of the invention.

Local Module Unit:

Referring to FIG. 11, an example of a block diagram of a Local Module Unit 10 is illustrated. In one embodiment, the primary function of the Local Module Unit 10 is to monitor the Pack Cells located inside Battery Module units sending Voltage and temperature conditions to the Pack Master. The Local Module Unit may also switch on bleed resistors when told to by the Pack Master. As shown in FIG. 11, the LTC6802-2 is a data acquisition IC capable of measuring the voltage of 12 series connected battery cells. An input multiplexer connects the batteries to a 12-bit delta-sigma analog to digital converter (ADC). Communication between the LTC6802-2 and a host processor is handled by a SPI compatible serial interface. The LTC6802-2 also contains circuitry to balance cell voltages. The host processor writes values to a configuration register inside the LTC6802-2 to control the switches. The open connection detection algorithm assures that an open circuit is not misinterpreted as a valid cell reading. The primary cell voltage A/D measurement commands (STCVAD and STOWAD) automatically turn off a cell's discharge switch while its voltage is being measured. The discharge switches for the cell above and the cell below will also be turned off during the measurement. Two self test commands can be used to verify the functionality of the digital portions of the ADC. It is important to note that the LTC6802-2 makes no decisions about turning on/off the internal MOSFETs. If signal from Pack Master is removed for more than 2.5 seconds, the Local Module Unit will turn off all bleed resistors in the on state and go into a standby condition.

Figure 12:
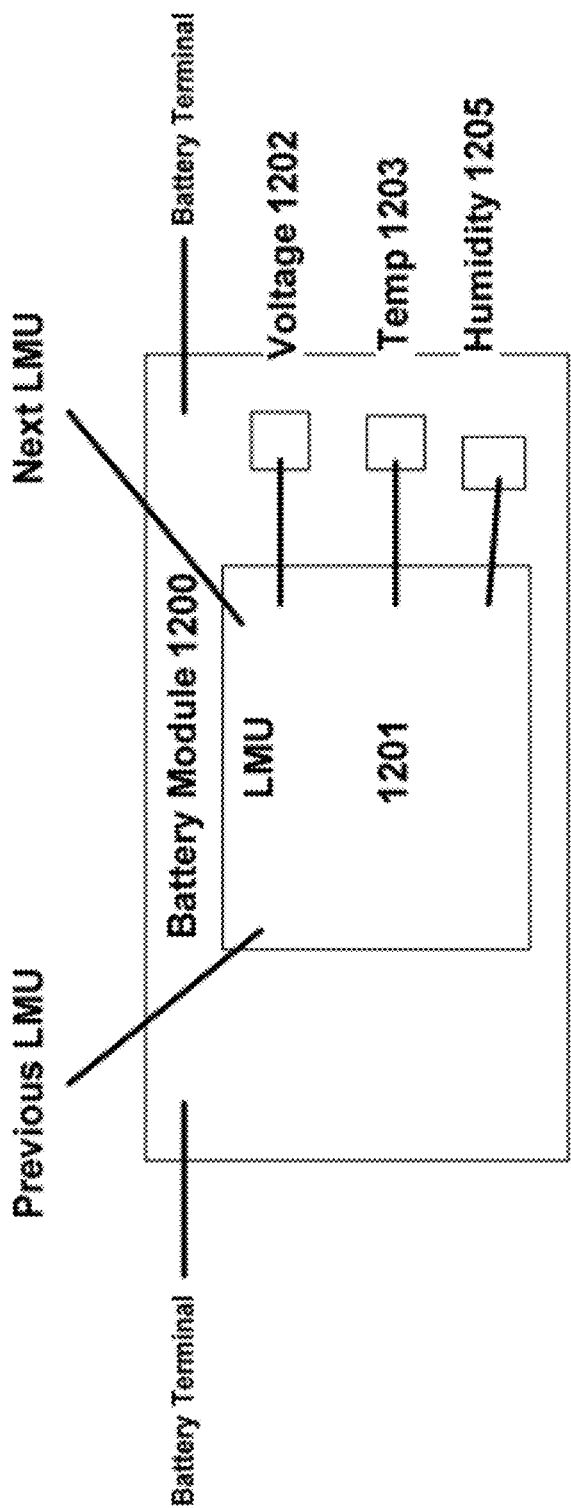
FIG. 12 illustrates an example of an architecture for a Local Module Unit, in accordance with embodiments of the invention.

As shown in FIG. 12, in one embodiment, a BMS may include a Local Module Unit 1201 which is a board that is attached to each battery module 1200 and gathers cell voltage 1202, temperature 1203, current 1204 and humidity 1205 from the cells in each battery module 1200. A Local Module Unit may continuously monitor individual cell voltages 1202, continuously monitor cell temperature 1203, be capable of shunting individual cell voltage to a bleed resistor, can have many temperature, voltage or other sensors attached at the module level. In one example, a Local Module Unit may have total power dissipation per cell at 32 W Maximum, 20 W Bleed Resistor and 12 W Mosfet Switch, can bypass a disabled cell with ~7 Amps carry current, can have up to 8 temperature monitors, and can have 4 temperature monitors and 4 peripheral monitors.

The Local Module Unit may be mounted directly to the Battery Module Unit, and an SPI Isolation Board may be mounded to the Local Module Unit. The SPI Isolation Board may isolate SPI signals from the Local Module Unit to the Pack Master. In one embodiment, the SPI Isolutioni Board isolates signal levels from the Local Module Unit to the Pack Master side at 2500V RMS for 1 minute per UL1577. In one embodiment, the SPI Isolation Board requires an external power source of 5 VDC+−0.5 VDC and has a current range of 2.45 mA to 90 mA. In one embodiment, the SPI Isolation Board will provide positive indication of power applied. The SPI Isolation Board may pass Clock signal when SPI is interrupted or removed.

In one embodiment, pinouts and connections for the Local Module Unit and SPI Isolation Board may be as follows:
Interface: J1, J2
The cable harness that connects to this interface is CAT5e.
Connector PN: AMP 43860-0001
Mate Connector PN:

TABLE 15

SPI Communication Pin Out

| Signal | Pin | Description | Current | Isolation |
|---|---|---|---|---|
| CS | 1 | Chip Select | 10 mA | 500 Vcont |
| SDO | 2 | Serial Data Out | 10 mA | 500 Vcont |
| SDI | 3 | Serial Data In | 10 mA | 500 Vcont |
| SCLK | 4 | Clock | 10 mA | 500 Vcont |
| GND | 5 | Ground | 120 mA | 500 Vcont |
| NC | 6 | No Connection | | |
| GND | 7 | Ground | 120 mA | 500 Vcont |
| 5VDC In | 8 | 5VDC | 120 mA | 500 Vcont |

Interface Name: Cell Balancing Interface
Connector: Molex MX150, 0194180038
The cable harness that connects to this interface is Battery Monitor.
Connector PN: Molex MX150, 0194290015
Mate Connector PN:

TABLE 16

LMU to Battery Cell Interface

| Signal | Pin | Current |
|---|---|---|
| Cell 1− | 1 | |
| Cell 1 + Cell 2− | 2 | |
| Cell 2 + Cell 3− | 3 | |
| Cell 3 + Cell 4− | 4 | |
| Cell 4 + Cell 5− | 5 | |
| Cell 5 + Cell 6− | 6 | |
| Cell 6 + Cell 7− | 7 | |
| Cell 7 + Cell 8− | 8 | |
| Cell 8 + Cell 9− | 9 | |
| Cell 9 + Cell 10− | 10 | |
| Cell 10+ | 11 | |
| NC | 12 | |

Connector Name: NTC Interface
The cable harness that connects to this interface is Battery NTC.
Connector PN: Molex MX150, 0194290010
Mate Connector PN:

TABLE 17

LMU to NTC Interface

| Signal | Pin | Current |
|---|---|---|
| NTC 1+ | 1 | |
| NTC 1− | 2 | |
| NTC 2+ | 3 | |
| NTC 2− | 4 | |
| NTC 3+ | 5 | |
| NTV 3− | 6 | |

Figure 13:
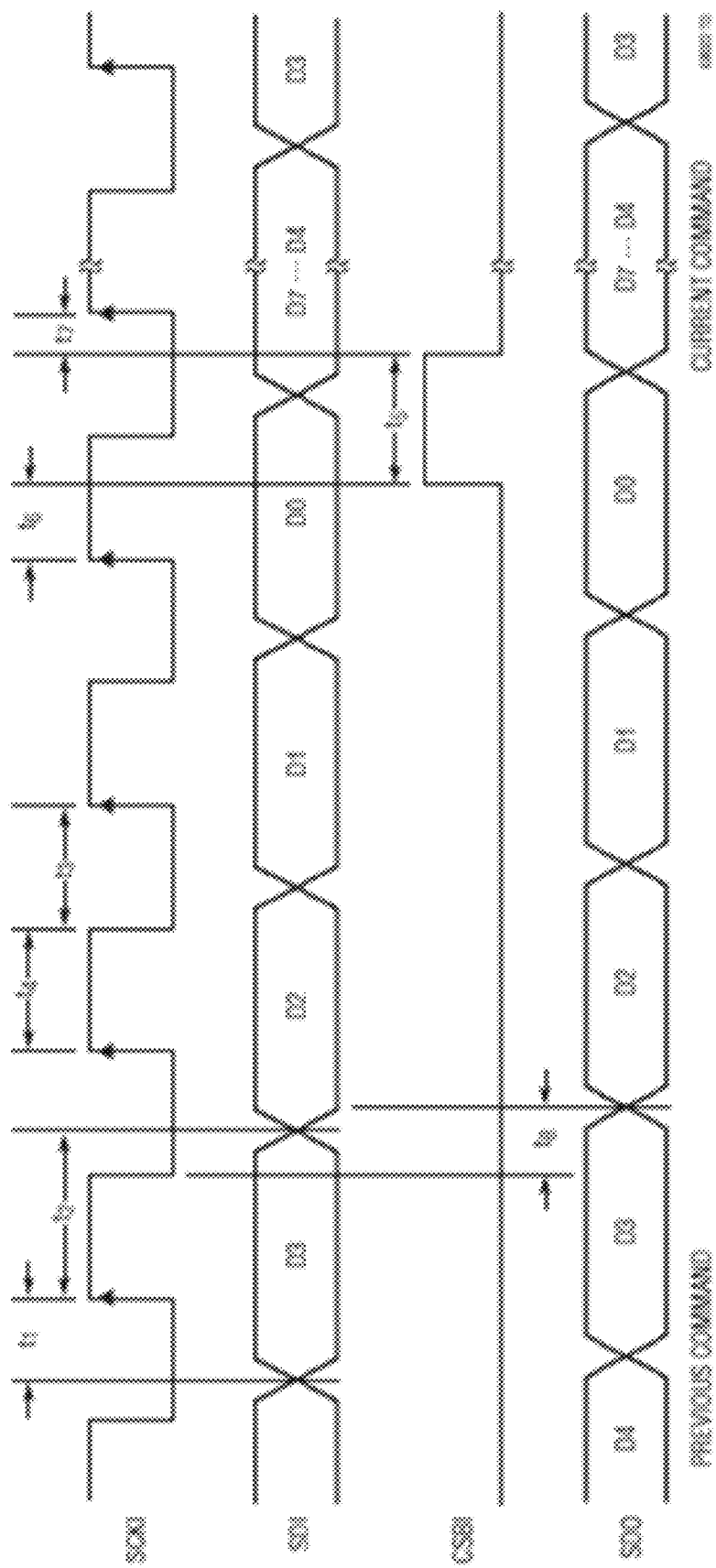
FIG. 13 illustrates an example of the timing of the SPI Interface, in accordance with embodiments of the invention.

The timing of the SPI Interface may operate in accordance with FIG. 13, as shown.

Integration within Vehicle:

In one embodiment, the design of the energy storage system accommodates space constraints of a vehicle. For example, a battery pack may be placed within the floor structure of a vehicle, below the floor surface, on a low floor transit bus and be able to maintain road clearance and approach/departure angles necessary to comply with bus standards, for example those set by the American Public Transit Association. Thus, a bus may also have a conventional bus seating pattern.

A large capacity (50 Ah) cell in a series string of batteries may be placed in parallel with additional strings and thus is significantly safer to operate in the event of a catastrophic failure than a parallel set of cells in series. Because lithium cells typically fail shorted, if a failed cell is in parallel with many other cells, then the other cells would typically discharge as much energy as possible into the damaged cell. Typically cells are put in parallel first to reduce the cost of battery management systems since each cell voltage must be measured. Because of the unique larger capacity cell, paralleling batteries before placing them in series is no longer necessary thus increasing the safety of the entire pack. Additionally, the anode change in the cell chemistry provides for an intrinsically safe cell that is also at a much higher power density. Further variations on the number of strings of batteries allow the size of the energy storage system to vary without having to add more controls to the vehicle or change anything with other strings.

Integration of a cooling system may maintain the packs at temperatures within the limits of the battery chemistry contained within the packs. In the event of no system cooling, the energy storage system may be operated for multiple hours in a fast charge mode without exceeding the recommended operating temperatures.

The battery pack may also be fully IP67 compliant and reject dust and water if submerged. The pack may be connected to the vehicle by two IP67 rated connectors as the only electrical connections to the vehicle which can be unlatched and pulled off quickly for ease of maintenance. All contacts on the connector may be touch-safe and de-energized when the connector is removed. Further, wiring and terminations within the pack may be sized and secured for a full 12 year cycle life of the vehicle. Impedance matching between packs may be gauged by comparing current flow through parallel strings, therefore allowing predictive maintenance of wiring and terminal attachments within the strings.

In one embodiment, the energy storage modules include multiple battery cells (for example, 10 cells, each at 2.3V, 50 Ah). The module housing may be designed to mechanically integrate and protect the cells as well as provide cooling and controls support. Battery management system connectors may be integrated into the front of the module for quick connection of an externally mounted battery management system board. Terminals may be offset and tapped for vertical installation of attachment bolts and ease of assembly. Modules may be isolated from each other to protect against potential short circuiting. This may be accomplished through material selection and post processing of aluminum heat sinks. If a short is ever detected through the battery management system, the system may disconnect each sub-pack in the string which will isolate the fault to ensure safety in the event of a major crash or failure of the isolation system.

In some embodiments, the energy system may be able to accept very high charge and discharge rates as well as carry a large amount of energy. Lithium titanate technology may be able to charge from 0% SOC to 90% SOC in as little as 1 minute (60 C rate) at the cell level and as little as 6 minutes (10 C rate) on the vehicle level. In some embodiments, the acceptable temperature range is −30° C. to 70° C. Within that range, in some embodiments, the system may deliver over 90% of the available energy in the pack giving an unprecedented range of temperatures in which a vehicle can operate.

All concepts of the invention may be incorporated or integrated with other systems and methods of battery management, including but not limited to those described in U.S. Patent Publication No. 2008/0086247 (Gu et al.), which is hereby incorporated by reference in its entirety.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that methods and structures within the scope of these claims and their equivalents be covered thereby.

Aspects of the systems and methods described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the systems and methods include: microcontrollers with memory, embedded microprocessors, firmware, software, etc. Furthermore, aspects of the systems and methods may be embodied in microprocessors having software-based circuit emulation, discrete logic (sequential and combinatorial), custom devices, fuzzy (neural network) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

It should be noted that the various functions or processes disclosed herein may be described as data and/or instructions embodied in various computer-readable media, in terms of their behavioral, register transfer, logic component, transistor, layout geometries, and/or other characteristics. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, email, etc.) over the Internet and/or other computer networks via one or more data transfer protocols (e.g., HTTP, FTP, SMTP, etc.). When received within a computer system via one or more computer-readable media, such data and/or instruction-based expressions of components and/or processes under the systems and methods may be processed by a processing entity (e.g., one or more processors) within the computer system in conjunction with execution of one or more other computer programs.

Unless specifically stated otherwise, as apparent from the following discussions, it is appreciated that throughout the specification, discussions utilizing terms such as "processing," "computing," "calculating," "determining," or the like, may refer in whole or in part to the action and/or processes of a processor, computer or computing system, or similar electronic computing device, that manipulate and/or transform data represented as physical, such as electronic, quantities within the system's registers and/or memories into other data similarly represented as physical quantities within the system's memories, registers or other such information storage, transmission or display devices. It will also be appreciated by persons skilled in the art that the term "users" referred to herein can be individuals as well as corporations and other legal entities. Furthermore, the processes presented herein are not inherently related to any particular computer, processing device, article or other apparatus. An example of a structure for a variety of these systems will appear from the description below. In addition, embodiments of the invention are not described with reference to any particular processor, programming language, machine code, etc. It will be appreciated that a variety of programming languages, machine codes, etc. may be used to implement the teachings of the invention as described herein.

Unless the context clearly requires otherwise, throughout the description and the claims, the words 'comprise,' 'comprising,' and the like are to be construed in an inclusive sense as opposed to an exclusive or exhaustive sense; that is to say, in a sense of 'including, but not limited to.' Words using the singular or plural number also include the plural or singular number respectively. Additionally, the words 'herein,' 'hereunder,' 'above,' 'below,' and words of similar import refer to this application as a whole and not to any particular portions of this application. When the word 'or' is used in reference to a list of two or more items, that word covers all of the following interpretations of the word: any of the items in the list, all of the items in the list and any combination of the items in the list.

The above description of illustrated embodiments of the systems and methods is not intended to be exhaustive or to limit the systems and methods to the precise form disclosed. While specific embodiments of, and examples for, the systems and methods are described herein for illustrative purposes, various equivalent modifications are possible within the scope of the systems and methods, as those skilled in the relevant art will recognize. The teachings of the systems and methods provided herein can be applied to other processing systems and methods, not only for the systems and methods described above.

The elements and acts of the various embodiments described above can be combined to provide further embodiments. These and other changes can be made to the systems and methods in light of the above detailed description.

In general, in the following claims, the terms used should not be construed to limit the systems and methods to the specific embodiments disclosed in the specification and the claims, but should be construed to include all processing systems that operate under the claims. Accordingly, the systems and methods are not limited by the disclosure, but instead the scope of the systems and methods is to be determined entirely by the claims.

While certain aspects of the systems and methods are presented below in certain claim forms, the inventor contemplates the various aspects of the systems and methods in any number of claim forms. Accordingly, the inventor reserves the right to add additional claims after filing the application to pursue such additional claim forms for other aspects of the systems and methods.

What is claimed is:

1. A battery management system for a battery assembly of an electric vehicle, the battery assembly including a plurality of battery strings connected in parallel, wherein (a) each battery string includes a plurality of battery packs, (b) each battery pack includes a plurality of battery modules packaged together in an enclosure, and (c) each battery module includes multiple battery cells packaged together in a module housing, comprising:
   a module control unit associated with each battery module, wherein the module control unit is a printed circuit board attached directly to each battery module, and positioned within the module housing of the battery module, wherein the module control unit associated with each battery module is separate from the module control unit associated with another battery module, and wherein each module control unit is configured to detect at least a voltage, a current, a humidity, and a temperature of a plurality of battery cells of the corresponding battery module;
   a Serial Peripheral Interface (SPI) isolation board attached to each module control unit; and
   a pack control unit associated with each battery pack, wherein each pack control unit is configured to perform cell balancing of the battery cells of the corresponding battery pack based on the voltages and temperatures detected by the module control units of the battery pack,
      wherein the module control units and the pack control unit of the battery pack are connected together using a Serial Peripheral Interface (SPI) bus, and wherein the SPI isolation board attached to each module control unit isolates SPI signals from the module control unit to the pack control unit.

2. The system of claim 1, wherein the electric vehicle is an electric bus, and wherein at least one battery pack of the plurality of battery packs is positioned under a floor of the bus.

3. The system of claim 2, wherein the pack control unit is operably coupled to an external charger of the electric vehicle.

4. The system of claim 1, wherein ten battery cells form a battery module, and eight battery modules form a battery pack.

5. The system of claim 1, further including an energy storage master control unit coupled to each pack control unit of the battery assembly, the energy storage master control unit being configured to monitor a state of health of the battery cells of the battery assembly and disconnect a battery string of the plurality of battery strings from service based on the state of health of a battery cell in the battery string to allow the vehicle to continue operating using the remaining battery strings.

6. The system of claim 1, wherein the pack control unit is configured to balance the multiple battery cells of the battery pack by buffering energy from a plurality of battery cells of the multiple battery cells into a capacitor and then transferring the buffered energy into one or more battery cells of the multiple battery cells.

7. The system of claim 1, wherein the multiple battery cells of each battery module are connected in series.

8. The system of claim 1, wherein the pack control unit is configured to balance the battery cells of a battery pack by discharging a battery cell into a resistor.

9. The system of claim 1, wherein the module control units and the pack control unit of a battery pack are connected together in series using the SPI bus.

10. The system of claim 1, wherein the module housing of each battery module includes electrical connectors to separably electrically connect the battery module to other battery modules of a battery pack.

11. The system of claim 1, wherein the module housing of each battery module includes a heat sink.

12. The system of claim 11, wherein the heat sink is an aluminum heat sink.

13. The system of claim 1, wherein the enclosure of each battery pack is an IP67 compliant housing, and wherein each enclosure includes one or more IP67 rated electrical connectors that provide the only electrical connections to contents of the enclosure.

14. A battery management system for an electric vehicle, comprising:
   a battery assembly including:
      a plurality of battery strings connected in parallel;
      a plurality of battery packs in each battery string of the plurality of battery strings, wherein each battery pack of the plurality of battery packs includes an enclosure which is IP67 compliant, and wherein each enclosure includes one or more IP67 rated electrical connectors that provide the only electrical connections to contents of the enclosure;
      a plurality of battery modules packaged within the enclosure of each battery pack, wherein each battery module of the plurality of battery modules includes a housing to provide isolation and cooling to contents of the housing, and wherein the housing includes one or more electrical connectors to provide separable electrical connection to contents of the housing; and
      a plurality of battery cells packaged within the housing of each battery module;
   a plurality of module control units, wherein each module control unit (a) is a printed circuit board attached to a single battery module of the plurality of battery modules and (b) is configured to detect at least a voltage, a current, a humidity, and a temperature of the plurality of battery cells of the battery module, and wherein the module control unit attached to each battery module is separate from the module control unit attached to another battery module;
   a plurality of Serial Peripheral Interface (SPI) isolation boards, wherein each SPI isolation board is attached to a single module control unit of the plurality of module control units; and
   a plurality of pack control units, wherein each pack control unit is associated with a single battery pack of the plurality of battery packs and is configured to perform cell balancing of the battery cells of the battery pack based on the voltages and temperatures detected by the module control units of the battery pack,
      wherein the module control units and the pack control unit of each battery pack are connected together using a Serial Peripheral Interface (SPI) bus, and wherein the SPI isolation board attached to each module control unit isolates SPI signals from the module control unit to the pack control unit.

15. The system of claim 14, wherein the electric vehicle is an electric bus, and wherein the plurality of battery packs are positioned under a floor of the bus.

16. The system of claim 14, further including an energy storage master control unit electrically connected to the plurality of packs control units, the energy storage master control unit being configured to monitor a state of health of the battery cells of the battery assembly and disconnect a battery string of the plurality of battery strings from service based on the state of health of a battery cell in the battery string to allow the vehicle to continue operating using the remaining battery strings.

17. The system of claim 14, wherein the pack control unit of each battery pack is configured to balance the battery cells of the battery pack by buffering energy from some battery cells into a capacitor and then transferring the buffered energy into other battery cells.

18. The system of claim 14, wherein the housing of each battery module includes a heat sink.

19. The system of claim 18, wherein the heat sink is an aluminum heat sink.

\* \* \* \* \*